US012619053B2

(12) United States Patent
Wu et al.

(10) Patent No.: US 12,619,053 B2
(45) Date of Patent: May 5, 2026

(54) PHOTOLITHOGRAPHY PROJECTION LENS

(71) Applicant: SUN YANG OPTICS DEVELOPMENT CO., LTD., Taoyuan City (TW)

(72) Inventors: Sheng Che Wu, Taoyuan City (TW); Yu Hung Chou, Taoyuan City (TW); Yi Hua Lin, Taoyuan City (TW); Yuan Hung Su, Taoyuan City (TW)

(73) Assignee: SUN YANG OPTICS DEVELOPMENT CO., LTD., Taoyuan City (TW)

( * ) Notice: Subject to any disclaimer, the term of this patent is extended or adjusted under 35 U.S.C. 154(b) by 794 days.

(21) Appl. No.: 17/944,457

(22) Filed: Sep. 14, 2022

(65) Prior Publication Data

US 2024/0085667 A1 Mar. 14, 2024

(51) Int. Cl.
 *G02B 9/64* (2006.01)
 *G03F 7/00* (2006.01)
(52) U.S. Cl.
 CPC ........... *G02B 9/64* (2013.01); *G03F 7/70241* (2013.01); *G03F 7/70383* (2013.01)
(58) Field of Classification Search
 CPC .... G02B 9/64; G03F 7/70241; G03F 7/70383
 See application file for complete search history.

(56) References Cited

FOREIGN PATENT DOCUMENTS

WO WO-2023198096 A1 * 10/2023 .............. G02B 13/18

OTHER PUBLICATIONS

WO 2023198096, translation (Year: 2023).*

* cited by examiner

*Primary Examiner* — Wen Huang
(74) *Attorney, Agent, or Firm* — Birch, Stewart, Kolasch & Birch, LLP

(57) ABSTRACT

A photolithography projection lens, having a plurality of lens elements and a light diaphragm arranged among them, arranged along an optical axis, and comprising an object side and an image side respectively arranged at the front and rear ends of the plurality of lens elements; wherein: the diopters of the two lenses respectively near the object side and the image side must be positive; each of the lens elements is a single lens without cement; the angle between the chief rays at different image height positions and the optical axis is <1 degree, and the angle between the chief rays at different object height positions and the optical axis is <1 degree; and under the projection of 350~450 nm wavelength light, it provide the imaging effect of precise magnification.

8 Claims, 5 Drawing Sheets

PHOTOLITHOGRAPHY PROJECTION LENS

BACKGROUND OF THE INVENTION

1. Field of the Invention

The present invention relates to a photolithography projection lens, particularly to a non-mask photolithography imaging projection lens that images onto a substrate with unit magnification and high resolution.

2. Description of the Related Art

The lithography process (photolithography) is an important step in the semiconductor unit manufacturing process. This step uses exposure and development to delineate the geometric pattern structure on the photoresist layer, and then transfers the pattern on the photomask to the substrate through the etching process; in other words, the lithography process is the process of "transferring" the circuit pattern to the wafer through the photomask and photoresist. Therefore, the lithography process requires very precise control over the shape and size of the image.

The lithographic process for the manufacture of semiconductor components or similar products is usually using a projection exposure device to expose a pattern of a photomask and image it onto a photoresist-coated wafer (or glass plate or similar object); since the cramming of the elements of the semiconductor elements us increased, the projection lens in the projection exposure device is required to have the functions of unit magnification and high resolution.

SUMMARY OF THE INVENTION

A primary objective of the present invention is to provide a photolithography projection lens without mask, such as a digital micro-reflector (DMD) from Texas Instruments (TI), imaging onto a substrate with unit magnification and high resolution.

Another objective of the present invention is to provide a photolithography projection lens that has a long working distance between substrates, and helps to control image aberrations and reduce manufacturing costs.

To achieve the objects mentioned above, the present invention provide a photolithography projection lens which is a unit magnification lens system suitable for photoresist feature imaging comprises: a plurality of lens elements and a light diaphragm arranged among them, arranged along an optical axis, and comprising an object side and an image side respectively arranged at the front and rear ends of the plurality of lens elements; wherein: the diopters of the two lenses respectively near the object side and the image side must be positive; each of the lens elements is a single lens without cement; the angle between the chief rays at different image height positions and the optical axis is <1 degree, and the angle between the chief rays at different object height positions and the optical axis is <1 degree; and under the projection of 350~450 nm wavelength light, it provide the imaging effect of precise magnification.

The aforementioned "light diaphragm" component refers to a rectangular or circular aperture in the optical system that can limit the light beam; it is generally used to control the intensity of light, reduce aberration and increase the depth of focus; the smaller the aperture is and the smaller the aberration is, the greater the depth of field is and the sharper the image is, but the brightness is reduced. In addition, "single lens without cement" means all lenses are the single lens in the projection lens, and there is no doublet lens that uses adhesive to combine multiple lenses.

Also, at least one of the first lens close to the object side and the first lens close to the image side is a non-biconvex lens.

Also, further includes a prism set in front of the object side, and the negative lenses before and after the light diaphragm must satisfy the Abbe number of $30<Vd<50$, and all lens elements must satisfy the refractive index of $1.45<Nd<1.75$, and the aperture is between 0.08 and 0.21.

Also, there are 10 lens elements, and their diopters are positive, positive, positive, positive, negative, negative, negative, positive, positive, positive from the image side to the object side in sequence, and the light diaphragm is placed between the fifth and the sixth lenses, the first to fifth lenses have an overall focal length of 35 to 50 mm, the sixth to tenth lenses have an overall focal length of 67 to 140 mm, and accordingly produce a lens with focal length>1000 mm and magnification of 0.25~75×.

Also, there are 12 lens elements, and their diopters are positive, positive, negative, positive, positive, negative, negative, positive, positive, negative, positive, positive from the image side to the object side in sequence, and the light diaphragm is placed between the sixth and the seventh lenses, the first to sixth lenses have an overall focal length of 140 to 165 mm, the seventh to twelfth lenses have an overall focal length of 72 to 82 mm, and accordingly produce a lens with focal length>1000 mm and magnification of 1.7~2.3×.

Also, there are 13 lens elements, and their diopters are positive, positive, positive, negative, negative, negative, positive, positive, positive, negative, positive, positive, positive from the image side to the object side in sequence, and the light diaphragm is placed between the eleventh and the twelfth lenses, the first to eleventh lenses have an overall focal length of 186 to 210 mm, the twelfth to thirteenth lenses have an overall focal length of 76 to 85 mm, and accordingly produce a lens with focal length>1000 mm and magnification of 2.2~2.7×.

Also, further includes a prism set in front of the object side, and all lens elements must satisfy the refractive index of $1.45<Nd<1.75$, and the aperture is between 0.08 and 0.21, then accordingly produce a lens with focal length>1000 mm, and there are 13 lens elements, and their diopters are positive, positive, negative, positive, positive, positive, negative, negative, positive, positive, negative, positive, positive from the image side to the object side in sequence.

Also, further includes a prism set in front of the object side, and all lens elements must satisfy the refractive index of $1.45<Nd<1.75$, and the aperture is between 0.08 and 0.21, then accordingly produce a lens with focal length >500 mm, and there are 13 lens elements, and their diopters are positive, positive, positive, negative, negative, positive, positive, negative, positive, positive, negative, positive, positive from the image side to the object side in sequence.

The benefit of the present invention is that when the angle between the chief ray of the object side and the image side and the optical axis is less than 1 degree, it can achieve the object and the image end are both the double telecentric lens, and the lens has good aberration and resolution. At the same time, the depth of field is large, and the image distance can maintain a considerable magnification within a certain range, and the light with a wavelength between 350-450 nm has a good transmittance, and the lenses without cement can also improve its durability.

DETAILED DESCRIPTION OF THE PREFERRED EMBODIMENT

Figure 1:
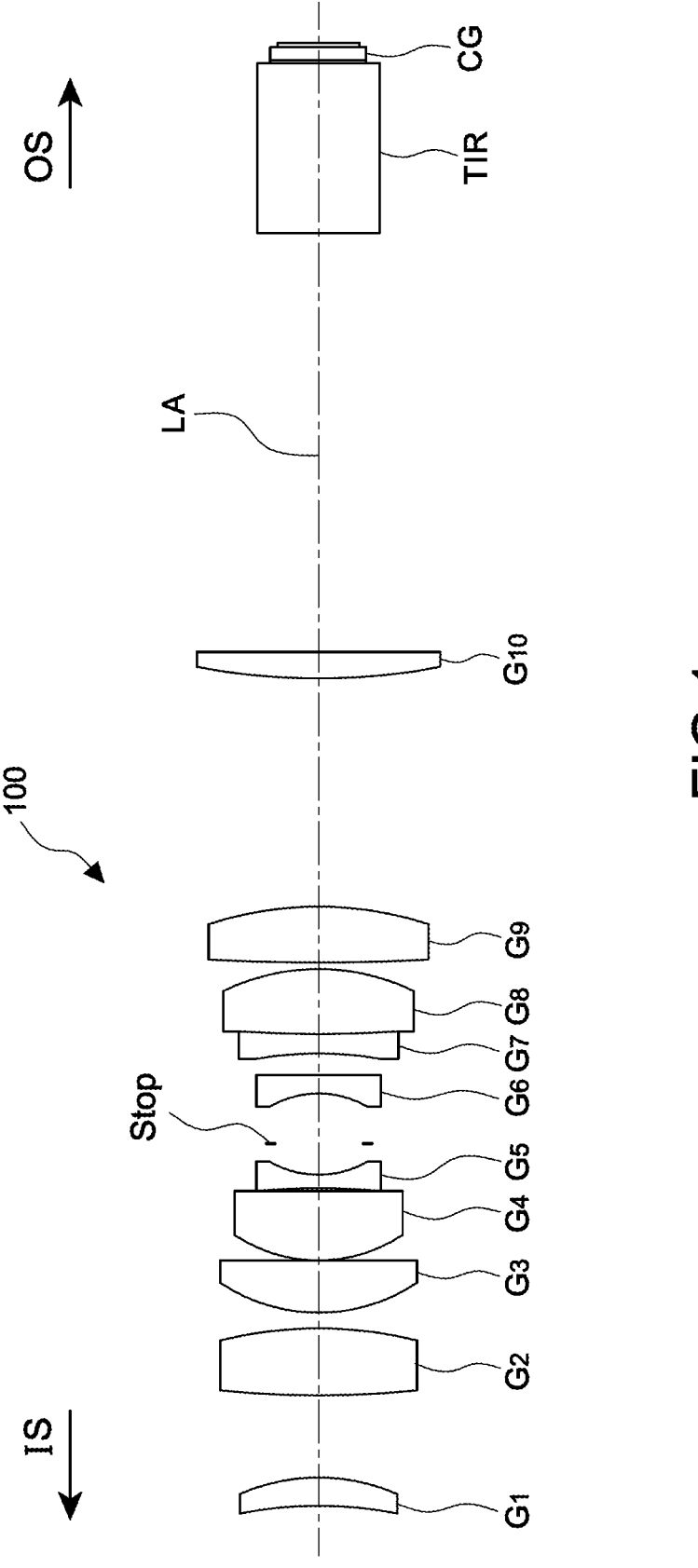
FIG. 1 is a schematic diagram illustrating lenses arrangement of the first embodiment the present invention.

Referring to FIG. 1, a photolithography projection lens 100 of the first embodiment of the present invention comprises an object side OS and an image side IS, between the object side OS and the image side IS are 10 lens elements arranged along an optical axis LA, and the 10 lens elements from the image side IS in sequence are a first lens G1 with positive diopter, a second lens G2 with positive diopter, a third lens G3 with positive diopter, a fourth lens G4 with positive diopter, a fifth lens G5 with negative diopter, a sixth lens G6 with negative diopter, a seventh lens G7 with negative diopter, an eighth lens G8 with positive diopter, a ninth lens G9 with positive diopter, a tenth lens G10 with positive diopter; a total reflection prism TIR and a cover glass CG arranged between the tenth lens G10 and the object side OS, a light diaphragm Stop is placed between the fifth lens G5 and the sixth lens G6, they are both negative lenses, their Abbe numbers are 36.4 and 36.4 respectively, so it satisfies the requirement of 30<Vd<50; from the first lens G1 to the tenth lens G10 have the refractive index between 1.49~1.73, satisfies the requirement of 1.45<Nd<1.75, and the aperture is between 0.08 and 0.21; In the present invention, the parameters such as radius, thickness, refractive index (Nd), and Abbe number (Vd) of each lens surface are recorded in the columns of Table 1; In the present invention, the angle between the chief rays at different image height positions and the optical axis LA is <1 degree, and the angle between the chief rays at different object height positions and the optical axis LA is <1 degree, and the numerical values of the image side chief rays angle Image CRA and the object side chief rays angle Object CRA generated by different image heights IH in this embodiment are respectively recorded in the columns of Table 2; moreover, the first G1 to fifth G5 lenses have an overall focal length of 38.2 mm, the sixth G6 to tenth G10 lenses have an overall focal length of 76.6 mm; Whereby, under the projection of 350~450 nm wavelength light, it accordingly produce a lens with focal length of 4045.8 mm and magnification of 0.498×.

TABLE 1

|  | Radius | Thickness | Nd | Vd |
|---|---|---|---|---|
| G1 | −64.70 | 6.00 | 1.73 | 54.7 |
|  | −43.30 | 18.70 |  |  |
| G2 | 218.30 | 14.90 | 1.5 | 81.6 |
|  | −95.40 | 3.60 |  |  |
| G3 | 36.50 | 12.10 | 1.49 | 70.6 |
|  | −360.00 | 0.20 |  |  |
| G4 | 35.80 | 14.60 | 1.52 | 64.2 |
|  | 191.40 | 1.00 |  |  |

TABLE 1-continued

|  | Radius | Thickness | Nd | Vd |
|---|---|---|---|---|
| G5 | −198.30 | 2.90 | 1.62 | 36.4 |
|  | 21.60 | 7.10 |  |  |
| Stop | Inf. | 11.50 |  |  |
| G6 | −19.40 | 4.00 | 1.62 | 36.4 |
|  | −1989.30 | 4.80 |  |  |
| G7 | −104.70 | 4.10 | 1.62 | 36.4 |
|  | 220.10 | 0.30 |  |  |
| G8 | 273.90 | 15.00 | 1.51 | 67.4 |
|  | −39.90 | 0.80 |  |  |
| G9 | 291.40 | 12.70 | 1.51 | 64.9 |
|  | −60.50 | 51.20 |  |  |
| G10 | 147.00 | 6.00 | 1.73 | 54.7 |
|  | −534.30 | 94.00 |  |  |
| TIR | Inf. | 38.00 | 1.64 | 60.2 |
|  | Inf. | 0.50 |  |  |
| CG | Inf. | 3.00 | 1.49 | 70.2 |
|  | Inf. | 0.50 |  |  |

TABLE 2

| IH (mm) | Object CRA (degree) | Image CRA (degree) |
|---|---|---|
| 0 | 0 | 0 |
| 0.8 | 0.010 | 0.010 |
| 1.6 | 0.010 | 0.020 |
| 2.4 | 0.020 | 0.020 |
| 3.2 | 0.020 | 0.030 |
| 4 | 0.020 | 0.040 |
| 4.8 | 0.030 | 0.040 |
| 5.6 | 0.030 | 0.050 |
| 6.4 | 0.030 | 0.050 |
| 7.2 | 0.030 | 0.050 |
| 8 | 0.030 | 0.050 |
| 8.76 | 0.030 | 0.050 |

Figure 2:
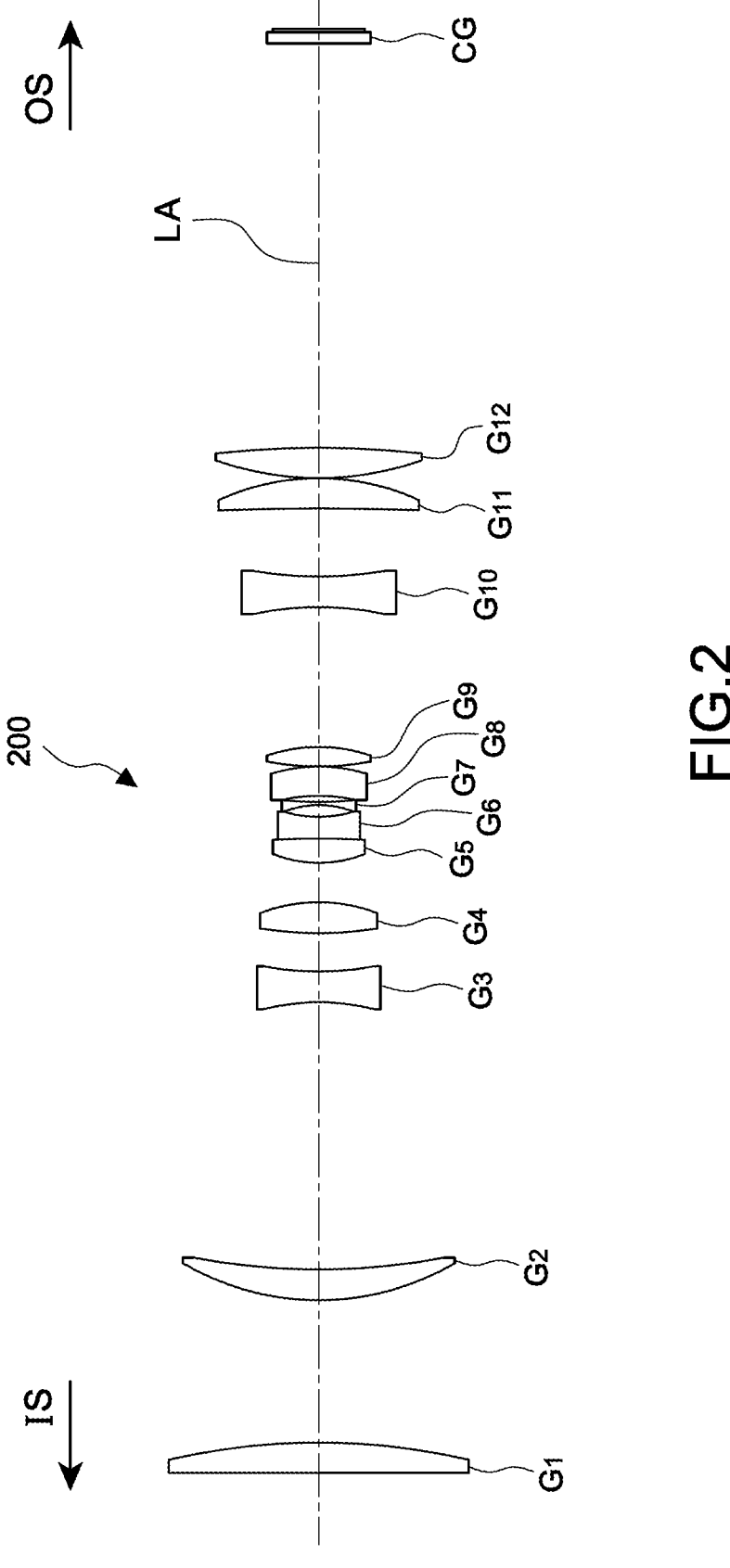
FIG. 2 is a schematic diagram illustrating lenses arrangement of the second embodiment the present invention.

Referring to the FIG. 2, a photolithography projection lens 200 of the second embodiment of the present invention comprises an object side OS and an image side IS, between the object side OS and the image side IS are 12 lens elements arranged along an optical axis LA, and the 12 lens elements from the image side IS in sequence are a first lens G1 with positive diopter, a second lens G2 with positive diopter, a third lens G3 with negative diopter, a fourth lens G4 with positive diopter, a fifth lens G5 with positive diopter, a sixth lens G6 with negative diopter, a seventh lens G7 with negative diopter, an eighth lens G8 with positive diopter, a ninth lens G9 with positive diopter, a tenth lens G10 with negative diopter, a eleventh lens G11 with positive diopter, a twelfth lens G12 with positive diopter; a cover glass CG arranged between the twelfth lens G12 and the object side OS, a light diaphragm Stop is placed between the sixth lens G6 and the seventh lens G7, they are both negative lenses, their Abbe numbers are 36.2 and 36.2 respectively, so it satisfies the requirement of 30<Vd<50; from the first lens G1 to the twelfth lens G12 have the refractive index between 1.48~1.72, satisfies the requirement of 1.45<Nd<1.75, and the aperture is between 0.08 and 0.21; In the present invention, the parameters such as radius, thickness, refractive index (Nd), and Abbe number (Vd) of each lens surface are recorded in the columns of Table 3; In the present invention, the angle between the chief rays at different image height positions and the optical axis LA is <1 degree, and the angle between the chief rays at different object height positions and the optical axis LA is <1 degree, and the numerical values of the image side chief rays angle Image CRA and the object side chief rays angle Object CRA generated by different image heights IH in this embodiment are respectively recorded in the columns of Table 4; moreover, the first G1 to sixth G6 lenses have an overall focal length of 142.8 mm, the seventh G7 to twelfth G12 lenses have an overall focal length of 73.2 mm; Whereby, under the projection of 350~450 nm wavelength light, it accordingly produce a lens with focal length of 7498.1 mm and magnification of 1.95×.

TABLE 3

|  | Radius | Thickness | Nd | Vd |
|---|---|---|---|---|
| G1 | Inf. | 8.00 | 1.61 | 44.2 |
|  | −183.10 | 37.61 |  |  |
| G2 | 75.56 | 8.00 | 1.61 | 44.2 |
|  | 201.15 | 70.56 |  |  |
| G3 | −65.37 | 7.99 | 1.61 | 37.2 |
|  | 74.97 | 10.10 |  |  |
| G4 | 108.71 | 8.00 | 1.48 | 70.2 |
|  | −48.73 | 10.47 |  |  |
| G5 | 33.39 | 6.11 | 1.48 | 70.2 |
|  | 652.98 | 0.68 |  |  |
| G6 | −135.21 | 5.46 | 1.62 | 36.2 |
|  | 34.15 | 1.37 |  |  |
| Stop | Inf. | 1.51 |  |  |
| G7 | −30.43 | 1.00 | 1.62 | 36.2 |
|  | 200.32 | 1.32 |  |  |
| G8 | −51.13 | 7.98 | 1.72 | 54.1 |
|  | −40.18 | 0.20 |  |  |
| G9 | 97.16 | 4.72 | 1.48 | 70.2 |
|  | −48.30 | 37.21 |  |  |
| G10 | −95.10 | 8.00 | 1.52 | 52.7 |
|  | 132.42 | 18.06 |  |  |
| G11 | −489.56 | 7.68 | 1.62 | 36.4 |
|  | −67.73 | 0.20 |  |  |
| G12 | 86.57 | 7.99 | 1.48 | 70.2 |
|  | −242.91 | 106.55 |  |  |
| CG | Inf. | 3.00 | 1.48 | 70.2 |
|  | Inf. | 0.50 |  |  |

TABLE 4

| IH (mm) | Image CRA (degree) | Object CRA (degree) |
|---|---|---|
| 0 | 0 | 0 |
| 1 | 0.001 | 0.000 |
| 2 | 0.003 | 0.001 |
| 3 | 0.005 | 0.002 |
| 4 | 0.007 | 0.004 |
| 5 | 0.012 | 0.007 |
| 6 | 0.017 | 0.011 |
| 7 | 0.024 | 0.017 |
| 8 | 0.034 | 0.026 |
| 9 | 0.046 | 0.036 |
| 10 | 0.060 | 0.049 |
| 11 | 0.078 | 0.066 |
| 12 | 0.100 | 0.086 |
| 12.65 | 0.116 | 0.100 |

Figure 3:
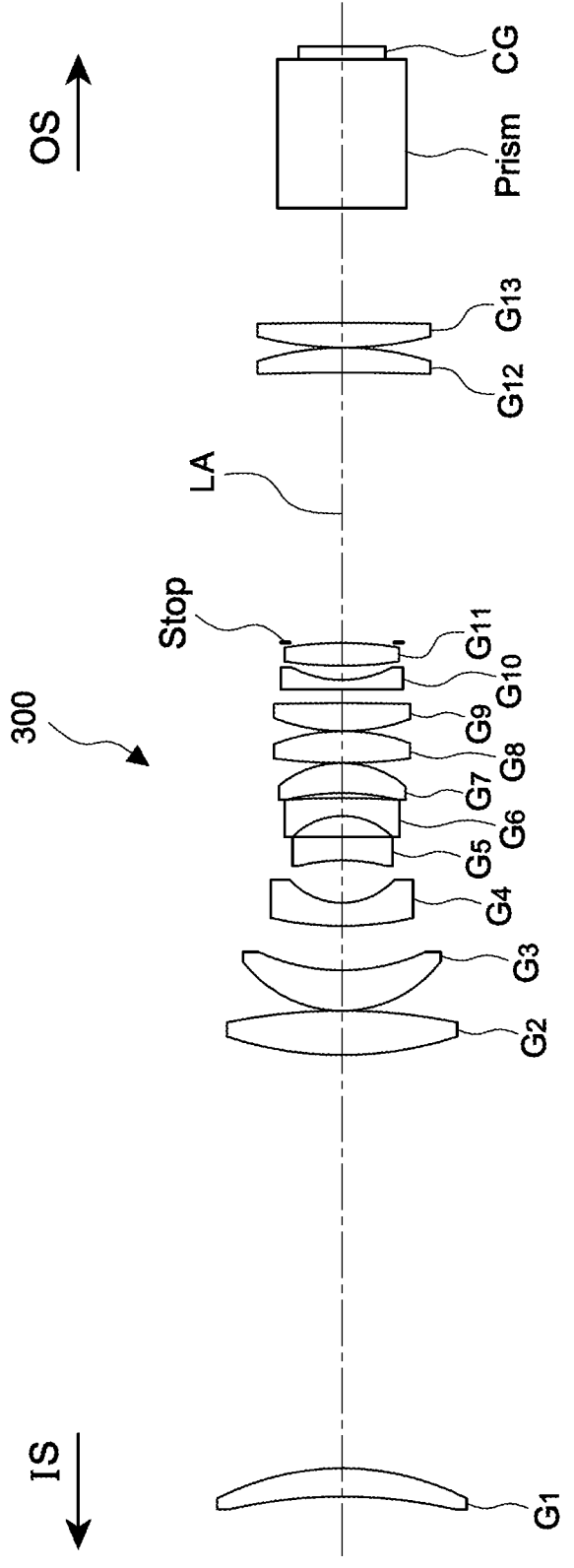
FIG. 3 is a schematic diagram illustrating lenses arrangement of the third embodiment the present invention.

Referring to the FIG. 3, a photolithography projection lens 300 of the third embodiment of the present invention comprises an object side OS and an image side IS, between the object side OS and the image side IS are 13 lens elements arranged along an optical axis LA, and the 13 lens elements from the image side IS in sequence are a first lens G1 with positive diopter, a second lens G2 with positive diopter, a third lens G3 with positive diopter, a fourth lens G4 with negative diopter, a fifth lens G5 with negative diopter, a sixth lens G6 with negative diopter, a seventh lens G7 with positive diopter, an eighth lens G8 with positive diopter, a ninth lens G9 with positive diopter, a tenth lens G10 with negative diopter, a eleventh lens G11 with positive diopter, a twelfth lens G12 with positive diopter, a thirteenth lens G13 with positive diopter; a prism and a cover glass CG arranged between the thirteenth lens G13 and the object side OS, a light diaphragm Stop is placed between the eleventh lens G11 and the twelfth lens G12, from the first lens G1 to the thirteenth lens G13 have the refractive index between 1.46~1.62, satisfies the requirement of 1.45<Nd<1.75, and the aperture is between 0.08 and 0.21; In the present invention, the parameters such as radius, thickness, refractive index (Nd), and Abbe number (Vd) of each lens surface are recorded in the columns of Table 5; In the present invention, the angle between the chief rays at different image height positions and the optical axis LA is <1 degree, and the angle between the chief rays at different object height positions and the optical axis LA is <1 degree, and the numerical values of the image side chief rays angle Image CRA and the object side chief rays angle Object CRA generated by different image heights IH in this embodiment are respectively recorded in the columns of Table 6; moreover, the first G1 to the eleventh lens G11 lenses have an overall focal length of 202.8 mm, the twelfth lens G12 to thirteenth lens G13 lenses have an overall focal length of 82.8 mm; Whereby, under the projection of 350~450 nm wavelength light, it accordingly produce a lens with focal length of 1327 mm and magnification of 2.52×.

TABLE 5

|  | Radius | Thickness | Nd | Vd |
|---|---|---|---|---|
| G1 | −159.82 | 7.17 | 1.62 | 36.36 |
|  | −100.8 | 117.81 |  |  |
| G2 | 133.82 | 12.13 | 1.62 | 36.36 |
|  | −206.1 | 0.24 |  |  |
| G3 | 42.71 | 11.37 | 1.62 | 36.36 |
|  | 78.213 | 12.85 |  |  |
| G4 | 122.64 | 6.00 | 1.62 | 36.36 |
|  | 24.053 | 13.05 |  |  |
| G5 | −59.863 | 6.00 | 1.62 | 36.36 |
|  | 267.54 | 5.90 |  |  |
| G6 | −24.713 | 5.51 | 1.62 | 36.36 |
|  | −147.98 | 1.44 |  |  |
| G7 | −76.888 | 8.23 | 1.50 | 75.54 |
|  | −32.344 | 0.20 |  |  |
| G8 | 178.56 | 8.39 | 1.50 | 81.60 |
|  | −68.825 | 0.40 |  |  |
| G9 | 54.186 | 8.21 | 1.50 | 81.59 |
|  | −766.1 | 4.13 |  |  |
| G10 | 724.26 | 2.50 | 1.62 | 36.36 |
|  | 48.695 | 3.82 |  |  |
| G11 | 133.09 | 6.35 | 1.50 | 81.60 |
|  | −120.08 | 0.20 |  |  |
| Stop | Inf. | 76.89 |  |  |
| G12 | Inf. | 6.54 | 1.62 | 36.36 |
|  | −137.46 | 0.20 |  |  |
| G13 | 114.63 | 7.97 | 1.62 | 36.36 |
|  | −369.75 | 31.74 |  |  |
| Prism | Inf. | 42.50 | 1.46 | 67.83 |
|  | Inf. | 0.00 |  |  |
| CG | Inf. | 3.00 | 1.49 | 70.42 |
|  | Inf. | 0.50 |  |  |

TABLE 6

| IH (mm) | Image CRA (degree) | Object CRA (degree) |
|---|---|---|
| 0 | 0 | 0 |
| 1 | 0.010 | 0.039 |
| 2 | 0.019 | 0.076 |
| 3 | 0.027 | 0.109 |
| 4 | 0.034 | 0.136 |
| 5 | 0.039 | 0.155 |
| 6 | 0.041 | 0.164 |

TABLE 6-continued

| IH (mm) | Image CRA (degree) | Object CRA (degree) |
|---|---|---|
| 7 | 0.041 | 0.159 |
| 8 | 0.037 | 0.139 |
| 9 | 0.029 | 0.100 |
| 10 | 0.017 | 0.039 |
| 11 | 0.000 | 0.049 |
| 12 | 0.023 | 0.167 |
| 12.6 | 0.040 | 0.255 |

Figure 4:
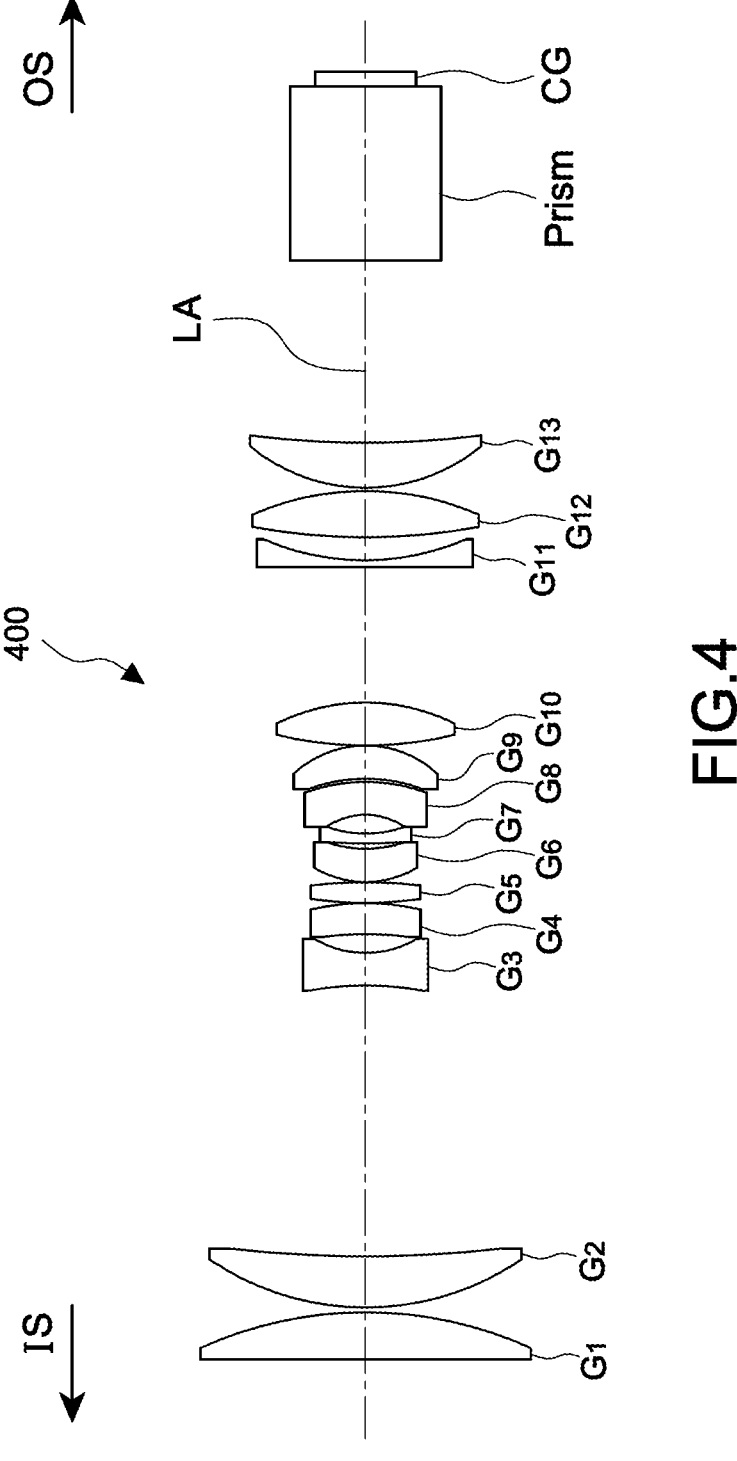
FIG. 4 is a schematic diagram illustrating lenses arrangement of the fourth embodiment the present invention.

Referring to the FIG. 4, a photolithography projection lens 400 of the fourth embodiment of the present invention comprises an object side OS and an image side IS, between the object side OS and the image side IS are 13 lens elements arranged along an optical axis LA, and the 13 lens elements from the image side IS in sequence are a first lens G1 with positive diopter, a second lens G2 with positive diopter, a third lens G3 with negative diopter, a fourth lens G4 with positive diopter, a fifth lens G5 with positive diopter, a sixth lens G6 with positive diopter, a seventh lens G7 with negative diopter, an eighth lens G8 with negative diopter, a ninth lens G9 with positive diopter, a tenth lens G10 with positive diopter, a eleventh lens G11 with negative diopter, a twelfth lens G12 with positive diopter, a thirteenth lens G13 with positive diopter; a prism and a cover glass CG arranged between the thirteenth lens G13 and the object side OS, a light diaphragm Stop is placed between the seventh lens G7 and the eighth lens G8, from the first lens G1 to the thirteenth lens G13 have the refractive index between 1.46~1.62, satisfies the requirement of 1.45<Nd<1.75, and the aperture is between 0.08 and 0.21; In the present invention, the parameters such as radius, thickness, refractive index (Nd), and Abbe number (Vd) of each lens surface are recorded in the columns of Table 7; In the present invention, the angle between the chief rays at different image height positions and the optical axis LA is <1 degree, and the angle between the chief rays at different object height positions and the optical axis LA is <1 degree, and the numerical values of the image side chief rays angle Image CRA and the object side chief rays angle Object CRA generated by different image heights IH in this embodiment are respectively recorded in the columns of Table 8; moreover, the first G1 to the seventh lens G7 lenses have an overall focal length of 145.47 mm, the eighth lens G8 to thirteenth lens G13 lenses have an overall focal length of 51.5 mm; Whereby, under the projection of 350~450 nm wavelength light, it accordingly produce a lens with focal length of 1011 mm and magnification of 2.52×.

TABLE 7

| | Radius | Thickness | Nd | Vd |
|---|---|---|---|---|
| G1 | −3063.851 | 11.57 | 1.52 | 64.1 |
| | −115.42 | 1.00 | | |
| G2 | 78.86 | 12.64 | 1.52 | 64.1 |
| | 367.06 | 66.91 | | |
| G3 | −105.24 | 8.00 | 1.51 | 65.5 |
| | 28.70 | 4.55 | | |
| G4 | −216.14 | 7.85 | 1.50 | 81.4 |
| | −69.34 | 0.20 | | |
| G5 | 173.22 | 5.04 | 1.52 | 64.1 |
| | −173.22 | 0.20 | | |
| G6 | 31.87 | 8.00 | 1.52 | 64.1 |
| | 43.97 | 1.51 | | |
| G7 | Inf. | 2.00 | 1.62 | 36.4 |
| | 42.22 | 1.78 | | |
| Stop | Inf. | 2.96 | | |

TABLE 7-continued

| | Radius | Thickness | Nd | Vd |
|---|---|---|---|---|
| G8 | −24.17 | 8.00 | 1.62 | 36.4 |
| | −58.72 | 1.01 | | |
| G9 | −46.80 | 8.00 | 1.50 | 81.6 |
| | −31.07 | 0.20 | | |
| G10 | 115.17 | 10.37 | 1.50 | 81.6 |
| | −59.46 | 33.03 | | |
| G11 | 418.09 | 2.00 | 1.52 | 64.1 |
| | 73.00 | 5.83 | | |
| G12 | 165.69 | 11.71 | 1.50 | 81.6 |
| | −80.58 | 0.98 | | |
| G13 | 53.90 | 10.64 | 1.50 | 81.6 |
| | 204.65 | 45.68 | | |
| Prism | Inf. | 42.50 | 1.46 | 67.8 |
| | Inf. | 0.01 | | |
| CG | Inf. | 3.00 | 1.49 | 70.4 |
| | Inf. | 0.49 | | |

TABLE 8

| IH (mm) | Image CRA (degree) | Object CRA (degree) |
|---|---|---|
| 0 | 0 | 0 |
| 1 | 0.018 | 0.049 |
| 2 | 0.034 | 0.096 |
| 3 | 0.050 | 0.138 |
| 4 | 0.062 | 0.174 |
| 5 | 0.072 | 0.200 |
| 6 | 0.077 | 0.213 |
| 7 | 0.077 | 0.211 |
| 8 | 0.071 | 0.191 |
| 9 | 0.058 | 0.149 |
| 10 | 0.035 | 0.077 |
| 11 | 0.003 | 0.024 |
| 12 | 0.041 | 0.166 |
| 12.6 | 0.073 | 0.272 |

Figure 5:
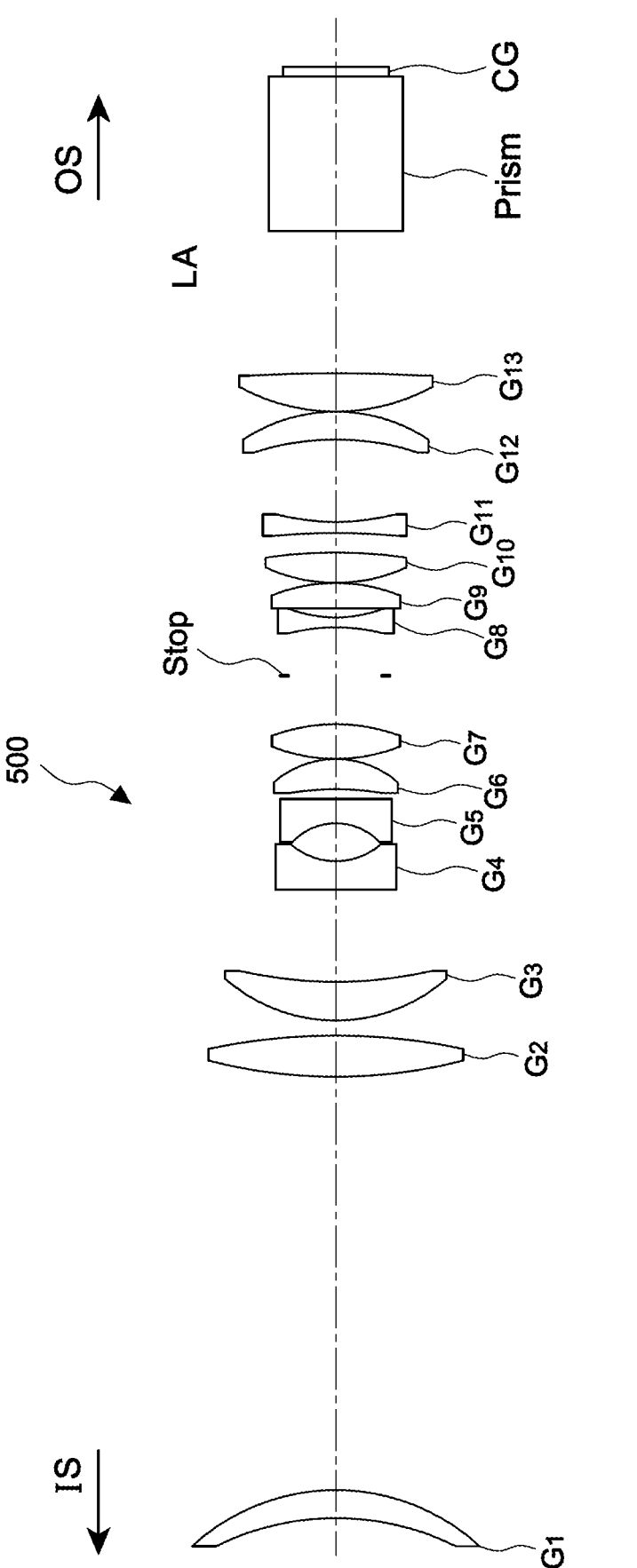
FIG. 5 is a schematic diagram illustrating lenses arrangement of the fifth embodiment the present invention.

Referring to the FIG. 5, a photolithography projection lens 500 of the fifth embodiment of the present invention comprises an object side OS and an image side IS, between the object side OS and the image side IS are 13 lens elements arranged along an optical axis LA, and the 13 lens elements from the image side IS in sequence are a first lens G1 with positive diopter, a second lens G2 with positive diopter, a third lens G3 with positive diopter, a fourth lens G4 with negative diopter, a fifth lens G5 with negative diopter, a sixth lens G6 with positive diopter, a seventh lens G7 with positive diopter, an eighth lens G8 with negative diopter, a ninth lens G9 with positive diopter, a tenth lens G10 with positive diopter, a eleventh lens G11 with negative diopter, a twelfth lens G12 with positive diopter, a thirteenth lens G13 with positive diopter; a prism and a cover glass CG arranged between the thirteenth lens G13 and the object side OS, a light diaphragm Stop is placed between the seventh lens G7 and the eighth lens G8, from the first lens G1 to the thirteenth lens G13 have the refractive index between 1.46~1.62, satisfies the requirement of 1.45<Nd<1.75, and the aperture is between 0.08 and 0.21; In the present invention, the parameters such as radius, thickness, refractive index (Nd), and Abbe number (Vd) of each lens surface are recorded in the columns of Table 9; In the present invention, the angle between the chief rays at different image height positions and the optical axis LA is <1 degree, and the angle between the chief rays at different object height positions and the optical axis LA is <1 degree, and the numerical values of the image side chief rays angle Image CRA and the object side chief rays angle Object CRA generated by different image heights IH in this embodiment are respectively recorded in the columns of Table 10; moreover, the first G1 to the seventh lens G7 lenses have an overall focal length of 168.3 mm, the eighth lens G8 to thirteenth lens G13 lenses have an overall focal length of 71 mm; Whereby, under the projection of 350~450 nm wavelength light, it accordingly produce a lens with focal length of 739 mm and magnification of 2.52×.

TABLE 9

| | Radius | Thickness | Nd | Vd |
|---|---|---|---|---|
| G1 | −92.24 | 8.00 | 1.50 | 81.48 |
| | −70.95 | 114.02 | | |
| G2 | 179.01 | 11.30 | 1.62 | 36.36 |
| | −203.90 | 4.32 | | |
| G3 | 59.01 | 10.62 | 1.62 | 36.36 |
| | 158.78 | 25.30 | | |
| G4 | Inf | 8.00 | 1.62 | 36.36 |
| | 24.69 | 10.24 | | |
| G5 | −23.81 | 6.93 | 1.62 | 36.36 |
| | 1841.04 | 2.42 | | |
| G6 | −120.57 | 8.58 | 1.50 | 81.48 |
| | −2.99E+01 | 0.20 | | |
| G7 | 64.35 | 9.22 | 1.50 | 81.59 |
| | −64.35 | 13.62 | | |
| Stop | Inf. | 13.51 | | |
| G8 | −91.07 | 2.50 | 1.62 | 36.36 |
| | 70.23 | 2.78 | | |
| G9 | Inf. | 6.92 | 1.50 | 81.48 |
| | −57.29 | 0.20 | | |
| G10 | 65.38 | 7.80 | 1.50 | 81.48 |
| | −249.95 | 6.01 | | |
| G11 | −168.11 | 2.50 | 1.62 | 36.36 |
| | 92.58 | 22.96 | | |
| G12 | −101.28 | 7.80 | 1.62 | 36.36 |
| | −55.28 | 0.20 | | |
| G13 | 69.17 | 10.49 | 1.62 | 36.36 |
| | −646.22 | 39.15 | | |
| Prism | Inf. | 42.50 | 1.46 | 67.83 |
| | Inf. | 0.10 | | |
| CG | Inf. | 3.00 | 1.49 | 70.42 |
| | Inf. | 0.40 | | |

TABLE 10

| IH (mm) | Image CRA (degree) | Object CRA (degree) |
|---|---|---|
| 0 | 0 | 0 |
| 1 | 0.016 | 0.070 |
| 2 | 0.032 | 0.138 |
| 3 | 0.046 | 0.198 |
| 4 | 0.058 | 0.250 |
| 5 | 0.066 | 0.286 |
| 6 | 0.071 | 0.305 |
| 7 | 0.070 | 0.302 |
| 8 | 0.064 | 0.271 |
| 9 | 0.051 | 0.207 |
| 10 | 0.028 | 0.096 |
| 11 | 0.003 | 0.063 |
| 12 | 0.046 | 0.288 |
| 12.6 | 0.077 | 0.458 |

Although particular embodiment of the invention has been described in detail for purposes of illustration, various modifications and enhancements may be made without departing from the spirit and scope of the invention. Accordingly, the invention is not to be limited except by the appended claims.

What is claimed is:

1. A photolithography projection lens, comprising:
a plurality of lens elements disposed along an optical axis and a light diaphragm arranged amongst the plurality of lens elements along the optical axis, and an object side and an image side are, respectively, defined at front and rear ends of the plurality of lens elements; and
a prism set in front of the object side, and negative lens elements of the plurality of lens elements disposed before and after the light diaphragm satisfies an Abbe number of 30<Vd<50, and each of the plurality of lens elements satisfy a refractive index of 1.45<Nd<1.75 and a numerical aperture between 0.08 and 0.21;
wherein diopters of two lens elements of the plurality of lens elements that are, respectively, closest to the object side and the image side are positive;
wherein each of the plurality of lens elements is formed of a single lens that does not include cement;
wherein an angle between chief rays at different image height positions and the optical axis is <1 degree and an angle between chief rays at different object height positions and the optical axis is <1 degree; and
thereby responsive to projection of 350~450 nm wavelength light, an imaging effect of a magnification within a nominal range is generated;
wherein at least one of a first lens element of the plurality of lens elements closest to the object side and a first lens element of the plurality of lens elements closest to the image side is a non-biconvex lens.

2. The photolithography projection lens as claimed in claim 1, wherein a number of the plurality of lens elements is ten (10), and diopters of the ten (10) plurality of lens elements are positive, positive, positive, positive, negative, negative, negative, positive, positive, and positive, respectively from the image side to the object side in sequence, and wherein the light diaphragm is placed between a fifth lens element and a sixth lens element of the plurality of lens elements, and a first lens element to the fifth lens element of the plurality of lens elements have an overall focal length of 35 to 50 mm, and the sixth lens element to a tenth lens element of the plurality of lens elements have an overall focal length of 67 to 140 mm, and thereby a lens having a focal length>1000 mm and the magnification within the range of 0.25~0.75× is generated.

3. The photolithography projection lens as claimed in claim 1, wherein a number of the plurality of lens elements is twelve (12), and diopters of the twelve (12) plurality of lens elements are positive, positive, negative, positive, positive, negative, negative, positive, positive, negative, positive, positive, respectively, from the image side to the object side in sequence, and wherein the light diaphragm is placed between a sixth lens element and a seventh lens element of the plurality of lens elements, and a first lens element of the plurality of lens elements to the sixth lens element of the plurality of lens elements have an overall focal length of 140 to 165 mm, and the seventh lens element of the plurality of lens elements to a twelfth lens element of the plurality of lens elements have an overall focal length of 72 to 82 mm, and thereby a lens having a focal length>1000 mm and the magnification within the range of 1.7~2.3× is generated.

4. The photolithography projection lens as claimed in claim 1, wherein a number of the plurality of lens elements is thirteen (13), and diopters of the thirteen (13) plurality of lens elements are positive, positive, positive, negative, negative, negative, positive, positive, positive, negative, positive, positive, positive, respectively from the image side to the object side in sequence, and wherein the light diaphragm is placed between an eleventh lens element and a twelfth lens element of the plurality of lens elements, and a first lens element of the plurality of lens elements to the eleventh lens element of the plurality of lens elements have an overall focal length of 186 to 210 mm, and the twelfth lens element of the plurality of lens elements to a thirteenth lens element of the plurality of lens elements have an overall focal length of 76 to 85 mm, and thereby a lens having a focal length>1000 mm and the magnification within the range of 2.2~2.7× is generated.

5. The photolithography projection lens as claimed in claim 1, further comprising: the prism set in front of the object side, and the each of the plurality of lens elements satisfy the refractive index of 1.45<Nd<1.75 and the numerical aperture between 0.08 and 0.21 to thereby generate a lens having a focal length >1000 mm.

6. The photolithography projection lens as claimed in claim 1, further comprising: the prism set in front of the object side, and the each of the plurality of lens elements satisfy the refractive index of 1.45<Nd<1.75 and the numerical aperture between 0.08 and 0.21 to thereby generate a lens having a focal length >500 mm.

7. The photolithography projection lens as claimed in claim 5, wherein a number of the plurality of lens elements is thirteen (13), and diopters of the thirteen (13) plurality of lens elements are positive, positive, negative, positive, positive, positive, negative, negative, positive, positive, negative, positive, positive, respectively from the image side to the object side in sequence.

8. The photolithography projection lens as claimed in claim 6, wherein a number of the plurality of lens elements is thirteen (13), and diopters of the thirteen (13) plurality of lens elements are positive, positive, positive, negative, negative, positive, positive, negative, positive, positive, negative, positive, positive, respectively from the image side to the object side in sequence.

\* \* \* \* \*